United States Patent
Ng

(10) Patent No.: US 7,923,831 B2
(45) Date of Patent: Apr. 12, 2011

(54) LED-BASED LIGHT SOURCE HAVING IMPROVED THERMAL DISSIPATION

(75) Inventor: Kee Yean Ng, Taman Inderawasih (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 646 days.

(21) Appl. No.: 11/755,912

(22) Filed: May 31, 2007

(65) Prior Publication Data

US 2008/0296590 A1 Dec. 4, 2008

(51) Int. Cl.
*H01L 23/04* (2006.01)
(52) U.S. Cl. .............. 257/692; 257/678; 257/E23.031
(58) Field of Classification Search .............. 257/678, 257/692, E23.031
See application file for complete search history.

(56) References Cited

U.S. PATENT DOCUMENTS

| 6,634,771 | B2 * | 10/2003 | Cao | 362/294 |
| 2005/0213334 | A1 * | 9/2005 | Lee et al. | 362/310 |

* cited by examiner

*Primary Examiner* — Hoai v Pham
*Assistant Examiner* — Elias Ullah

(57) ABSTRACT

A light source having a plurality of dies mounted on leads that are partially enclosed in a plastic body is disclosed. Each die is powered by first and second contacts. One contact is connected to the lead on which the die is mounted. Light from the LED exits the die through the top surface. Each lead includes a layer of metal of substantially constant thickness. The layer includes a boundary, a die mounting region within the boundary and a heat transfer region within the boundary. The boundary increases in a dimension perpendicular to a line connecting the die mounting region and the heat transfer region. The leads are arranged such that the die mounting regions are proximate to a first point and oriented such that the lines radiate from the first point. The light source can be manufactured using conventional lead frame techniques.

20 Claims, 8 Drawing Sheets

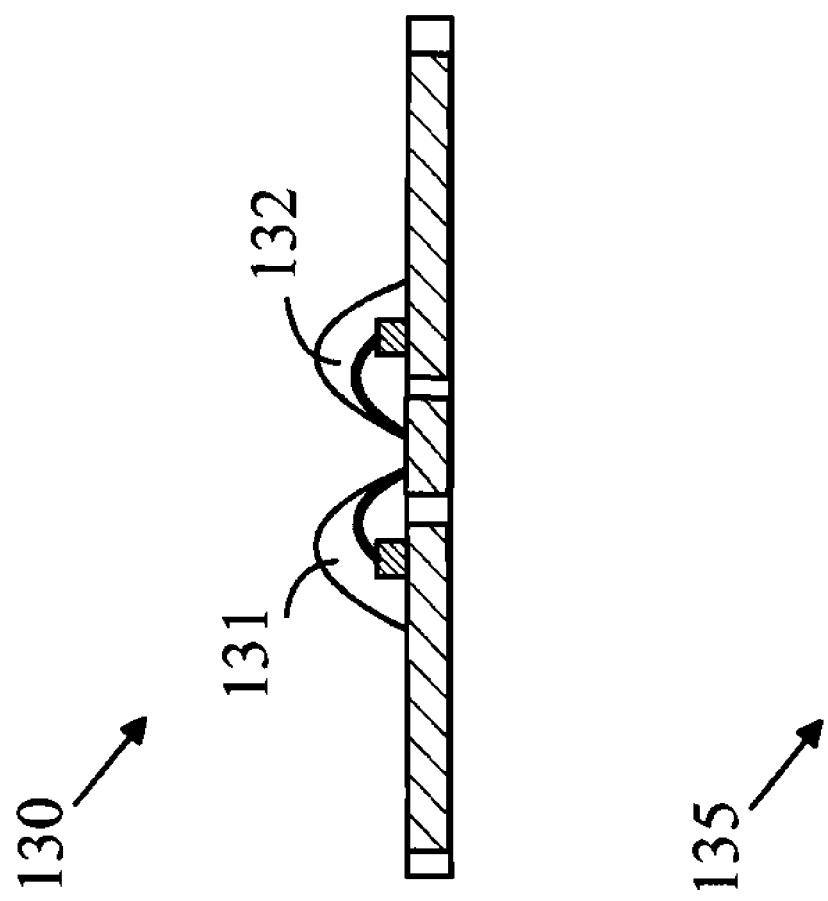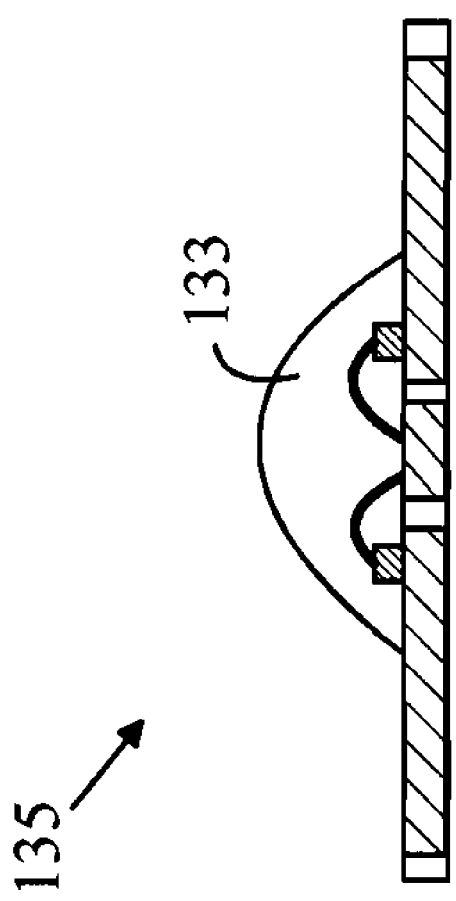

_US 7,923,831 B2_

LED-BASED LIGHT SOURCE HAVING IMPROVED THERMAL DISSIPATION

BACKGROUND OF THE INVENTION

Light emitting diodes (LEDs) are attractive candidates for replacing conventional light sources such as incandescent lamps and fluorescent light sources. Some LEDs have higher light conversion efficiencies and longer lifetimes than the conventional sources.

Unfortunately, LEDs have a number of problems that have inhibited their widespread use as replacement light sources. First, the power output of a single LED is significantly lower than that of a conventional light source, and hence, a number of LED dies must be utilized to provide a source that can deliver light at intensities consistent with the light levels provided by conventional light sources. In addition, some LED light sources utilize LEDs that emit different colors, e.g. red, green, and blue, to produce light that is perceived by a human observer to be of a specific color that is different from that of the individual LEDs. Hence, inexpensive packaging that can hold a number of dies is required.

Second, the high light conversion efficiencies that make LEDs attractive as replacement candidates depend on providing an environment in which the heat generated by the LED is efficiently removed so that the LED is not subjected to high temperatures. For the purposes of this discussion, the light conversion efficiency of a light source is defined to be the amount of light generated per watt of electricity consumed by the light source. The light conversion efficiency of the LEDs that are currently available decreases rapidly with increasing temperature. In addition to reducing the light conversion efficiency, heat also shortens the lifetime of the LED and can lead to premature total device failure. Hence, any packaging arrangement must provide an efficient path for removing heat from the dies.

Lead frame packages are attractive from a cost point of view. However, lead frame packages that accommodate multiple LEDs and provide sufficient heat dissipation are not available for high power dies. These packages typically rely on moving heat from the LED to an outside heat dissipating surface by placing the LEDs on the internal portion of the leads and relying on the lead to move the heat to the heat dissipating surface. Unfortunately, the heat paths tend to have too high of a thermal resistance, and hence, the heat dissipation is not sufficient for many applications.

SUMMARY OF THE INVENTION

The present invention includes a light source having a plurality of dies mounted on leads that are partially enclosed in a plastic body. Each die has a top and bottom surface and includes an LED that is powered through first and second contacts on the die. The first contact is located on the bottom surface and light from the LED exits the die through the top surface. Each lead includes a layer of metal of substantially constant thickness. The layer includes a boundary, a die mounting region within the boundary and a heat transfer region within the boundary. The boundary increases in a dimension perpendicular to a line connecting the die mounting region and the heat transfer region. The leads are arranged such that the die mounting regions are proximate to a first point and oriented such that the lines radiate from the first point. The body includes an insulating material that covers at least a portion of each of the leads while leaving the heat transfer regions of each of the leads exposed. In one aspect of the invention, the light source includes a common electrode that is connected to the second contact of each of the dies. In another aspect of the invention, the body includes a reflector that surrounds the dies and redirects light leaving the side surfaces. In yet another aspect of the invention, the exposed regions of the heat transfer regions are located on the bottom surface of the light source.

BRIEF DESCRIPTION OF THE DRAWINGS

FIG. 10 is a cross-sectional view of a light source according to another embodiment of the present invention.

FIG. 11 is a cross-sectional view of another embodiment of a light source according to the present invention.

DETAILED DESCRIPTION OF THE PREFERRED EMBODIMENTS OF THE INVENTION

Figure 2:
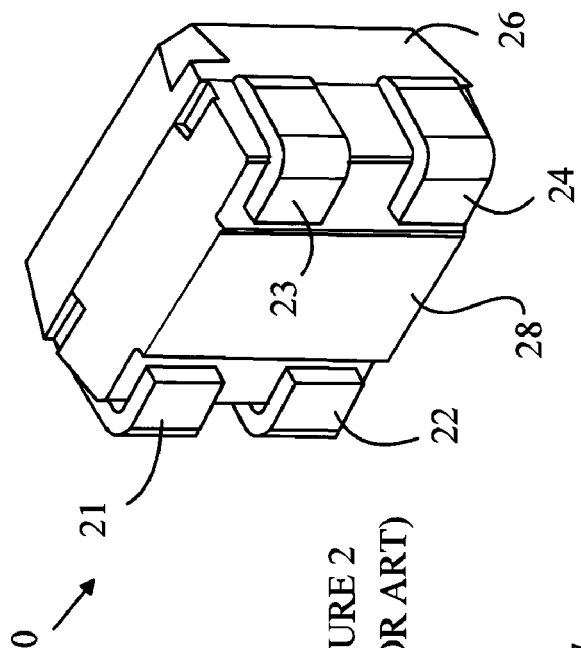
FIGS. 1 and 2 are perspective views of prior art light source 20.
Figure 1:
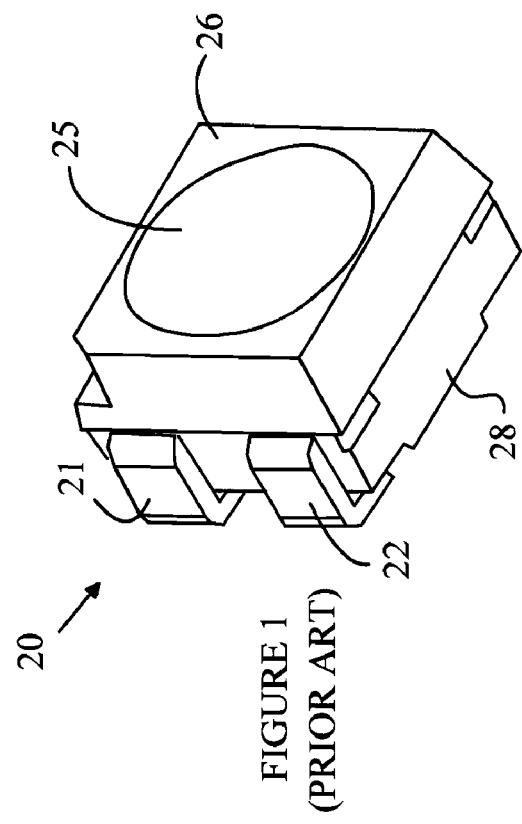
Figure 3:
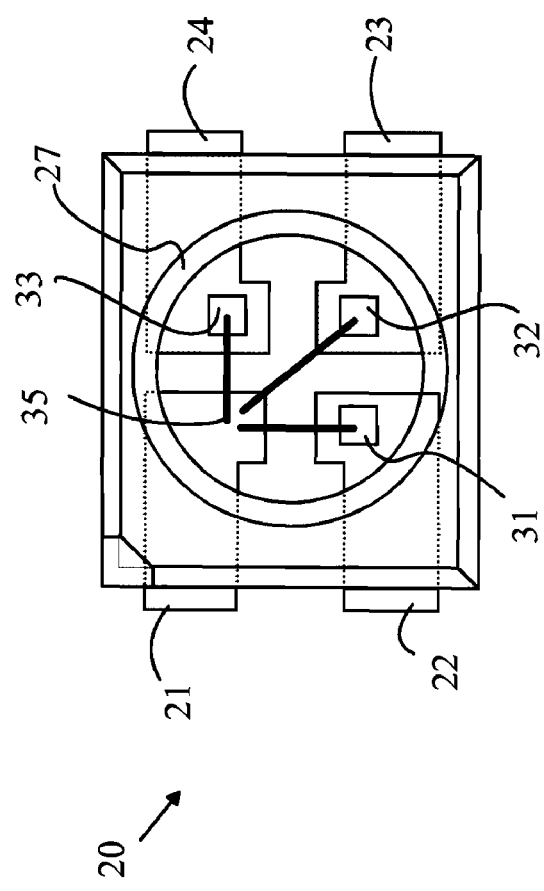
FIG. 3 is a top view of prior art light source 20.

The manner in which the present invention provides its advantages can be more easily understood with reference to FIGS. 1-3, which illustrate a prior art multi-LED packaged light source 20. FIGS. 1 and 2 are perspective views of light source 20, and FIG. 3 is a top view of light source 20. To simplify the drawings, the details of the die placements and connections have been omitted from FIG. 1.

Light source 20 is constructed from a lead frame that is cut to provide leads 21-24 in the finished light source. LED dies 31-33 are mounted on leads 22-24, respectively. The dies are powered by applying a potential to a first contact on the bottom of each LED and a second contact on the top of each LED. The second contacts are connected to lead 21 by wire bonds such as wire bond 35. The contacts are accessed by the portions of the leads that extend outside the package.

The package includes two parts. The lower part 28 is molded around the leads after the dies have been attached to the leads and the various wire bonds formed. The upper portion 26 includes a cavity 25 having a reflective wall 27. The upper portion is bonded to the lower portion after the lower portion is molded. The lead frame is then cut to leave the leads extending outside the package. Finally, the leads are bent to provide pads that extend under the package. These pads can be used to surface mount the packaged light source.

The heat generated by each die must be conducted away from that die by the lead on which that die is mounted. The heat is routed to the printed circuit board on which the package is mounted. The heat circuit can be viewed as consisting of a heat source, i.e., the LED, on one end of a linear heat conductor with the other end of the linear heat conductor held at a constant temperature, i.e., the temperature of the core of the printed circuit board on which the package is mounted. The thermal resistance of this path depends on the length and cross-sectional dimension of the lead. For typical lead frame dimensions, this path has sufficient resistance to lead to a rise in the temperature of the LED die when a high power die is utilized.

Figure 4:
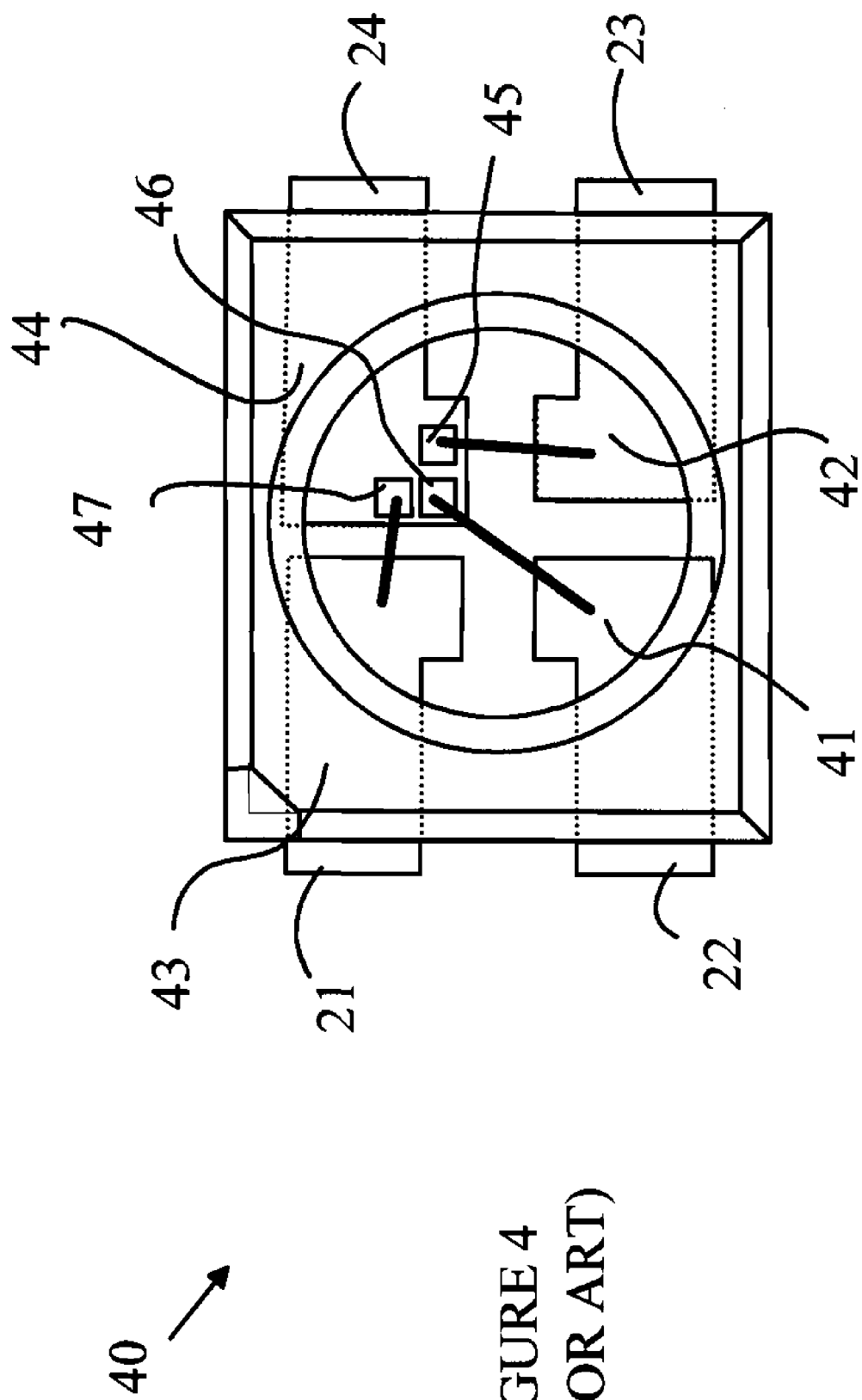
FIG. 4 is a top view of another prior art light source.

Refer now to FIG. 4, which is a top view of another prior art light source. Light source 40 utilizes a lead frame that is similar to that utilized by light source 20 discussed above. However, in light source 40, the individual LED dies 45-47 are mounted on a common lead 44. The remaining leads shown at 41-43 are used to provide electrical connections to one of the power terminals on each die. The second terminal on each die is electrically connected to lead 44. Lead 44 is also the thermal path through which most of the heat generated by dies 45-47 is removed from the package and eventually transferred to a substrate on which light source 40 is mounted through lead 24. It should be noted that this prior art design has thermal resistance problems that are even worse than those discussed above with respect to FIGS. 1-3.

Figure 5:
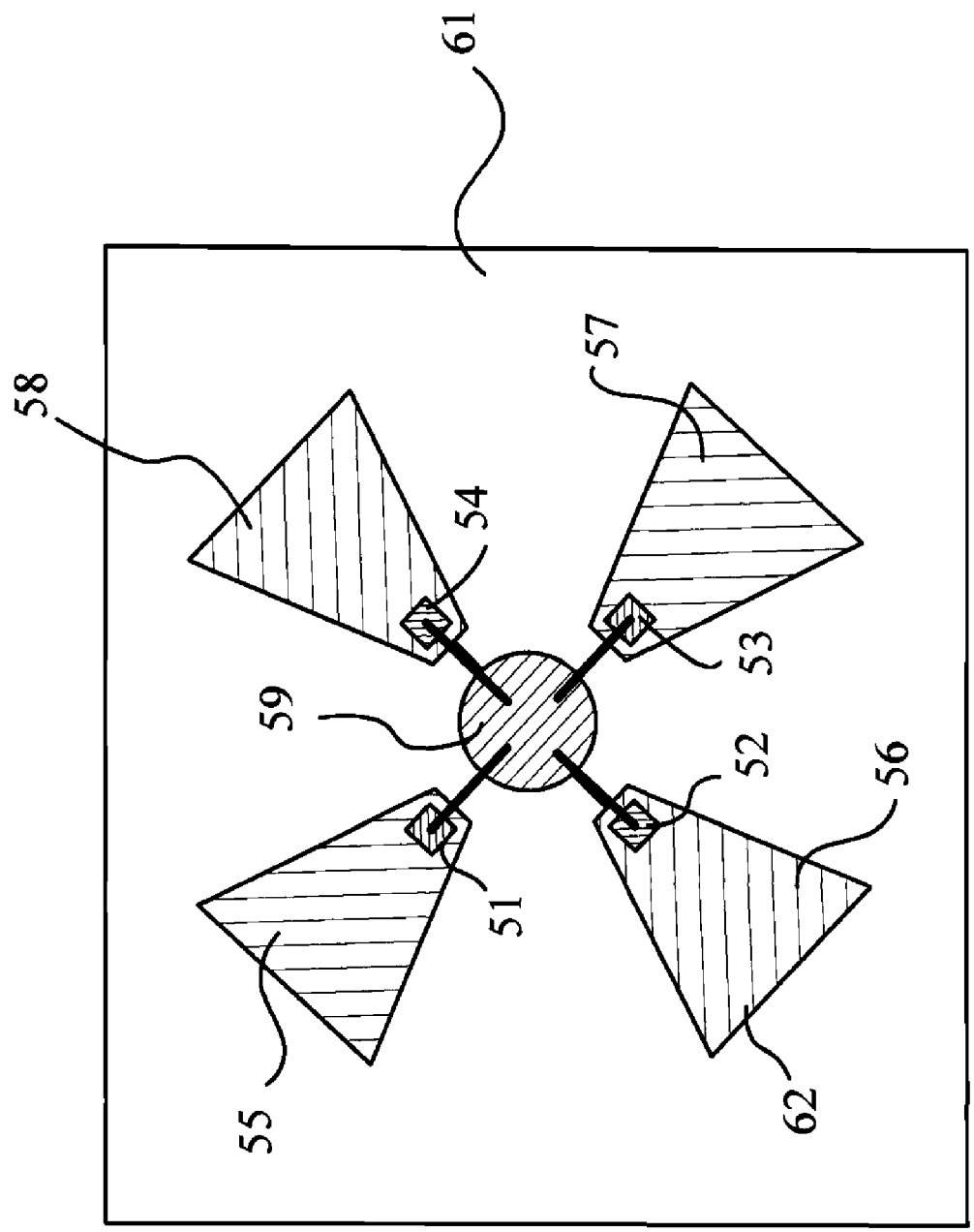
FIG. 5 is a top view of a light source according to one embodiment of the present invention.

The present invention is based on the observation that the thermal resistance between the point at which the die is attached and the point at which the heat is transferred to the final heat dissipating element such as the core of an underlying printed circuit board can be reduced by increasing the average cross-sectional area of the lead between those two points. Changing the width of the lead frame is less expensive than changing the thickness of the lead frame. Refer now to FIG. 5, which is a top view of a light source according to one embodiment of the present invention. Light source 50 includes 4 LED dies 51-54 that are bonded to the four elements of the lead frame shown at 55-58, respectively. The lead frame is molded into a body 61. The dies are powered by applying a potential difference between two contacts on each die. In light source 50, one of the contacts is on the bottom side of the die and is connected electrically as well as thermally to the lead frame on which that die is mounted. The other contact is on the top surface of the die and is connected by a wire bond to a central lead 59, which acts as a common contact for all of the dies.

Each of the leads on which the dies are mounted has a narrow region on which the die is mounted and a wider region such as region 62. The cross-sectional area of the lead increases monotonically with the distance from the die to region 62. As a result, the thermal impedance of the lead between region 62 and the die is less than the thermal impedance of the leads shown in FIGS. 1-4. Accordingly, substantially more heat can be moved from the die to a heat sink connected to region 62.

Figure 6:
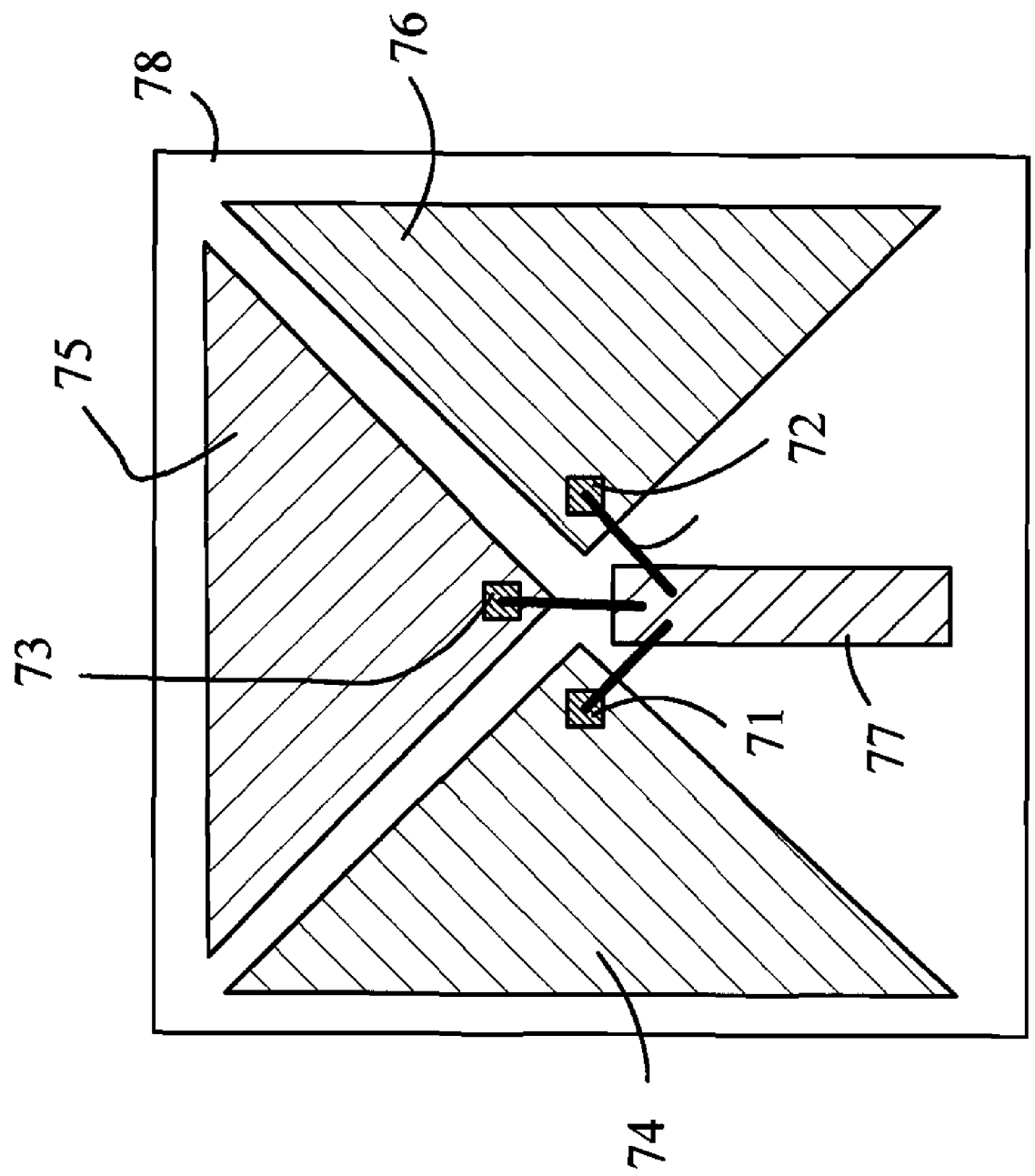
FIG. 6 illustrates another embodiment of a light source according to the present invention.

Refer now to FIG. 6, which illustrates another embodiment of a light source according to the present invention. Light source 70 includes three LED dies shown at 71-73. Each die is mounted on a corresponding lead. The leads corresponding to dies 71-73 are shown at 74-76, respectively. Light source 70 is similar to light source 50 discussed above in that the bottom terminal on each die is connected electrically and thermally to the lead on which the die is mounted. The top terminal is connected by a wire bond to a fourth lead 77. Light source 70 utilizes leads that substantially maximize the cross-sectional area in the region that is distal from the die mounted on the lead and provide a thermal resistance that is substantially maximized for the area available within package 78.

Figure 8:
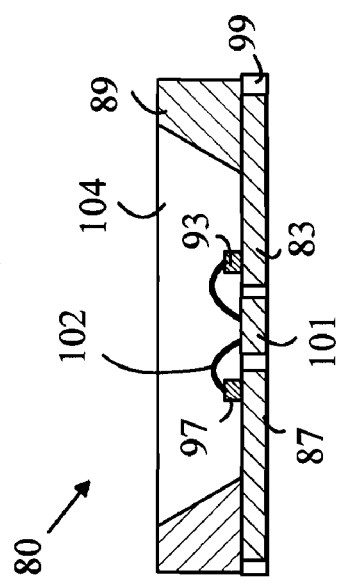
FIG. 8 is a cross-sectional view of light source 80 through line 8-8.
Figure 7:
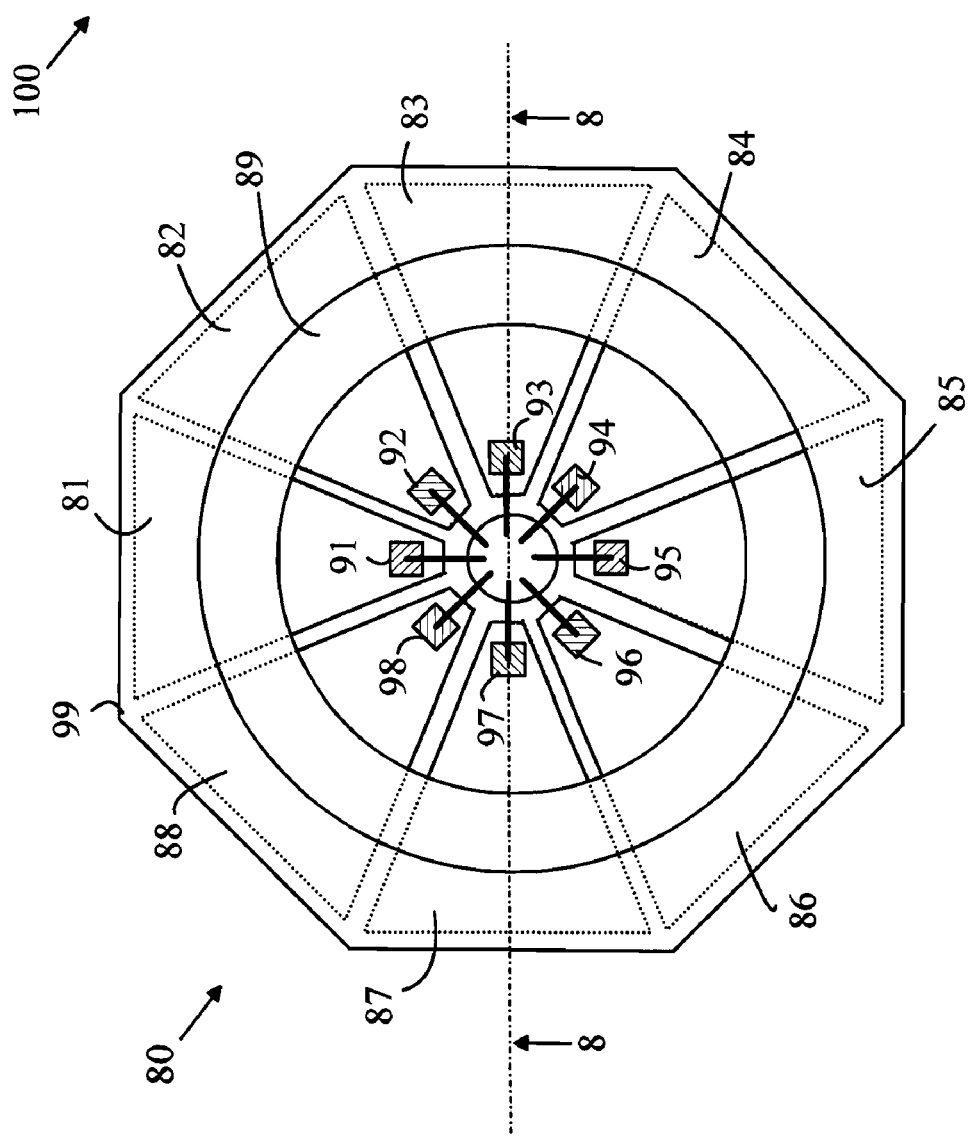
FIG. 7 is a top view of light source 80.

The lead frame arrangement of the present invention can be expanded to accommodate additional dies. Refer now to FIGS. 7 and 8, which illustrate another embodiment of a light source according to the present invention. FIG. 7 is a top view of light source 80, and FIG. 8 is a cross-sectional view of light source 80 through line 8-8. Light source 80 utilizes a lead frame in which the leads are arranged in a star configuration. Light source 80 includes 8 LED dies 91-98, each die being attached to the surface of one lead of the lead frame near one of the ends of that lead. The leads corresponding to dies 91-98 are shown at 81-88, respectively. Each die has one power terminal connected to the lead on which the die is mounted and one terminal connected to a common lead 101 by a wire bond such as wire bond 102 shown in FIG. 8. The dies are connected at the narrow portion of the leads. The leads have a cross-section that expands as a function of the distance from the die.

A reflector 89 is incorporated in light source 80 to redirect light that leaves the side surfaces of the dies so that the reflected light is traveling at angles that are substantially within the cone of angles of the light that leaves the top surface of the dies. The reflector can be molded as part of housing 99 or attached separately to housing 99 after the lead frame has been encapsulated in the plastic used for housing 99. Finally, a clear encapsulant is used to fill the reflector. The encapsulant can include light conversion materials for altering the wavelength of light that leaves the light source and/or diffusants that scatter the light such that the light source appears to be a uniform source having dimensions substantially equal to those of the reflector. The top surface of encapsulant layer 104 can be also be molded to provide a curved surface that improves the light extraction from the light source or provides optical processing functions such as light collimation.

As noted above, the heat that is transferred from the dies to the leads must eventually be dissipated in some structure that is connected to the leads such as the core of an underlying printed circuit board on which the light source is mounted. In the embodiment shown in FIG. 8, the leads are exposed on the bottom surface of the package. Hence, a connection can be made at any point along the exposed surface. Heat will travel laterally from the die on the lead to the connection point. As long as the thermal resistance of the connection is small compared to that of the lead between the die and the connection point, the location of the connection point is not critical.

Figure 9:
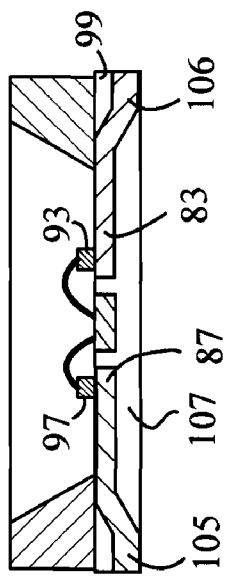
FIG. 9 is a cross-sectional view of a light source according to another embodiment of the present invention.

In some cases, it may be advantageous to enclose the leads in the material that is molded to form light source body 99. Such arrangements provide protection against delaminating of the leads from the light source body. Refer now to FIG. 9, which is a cross-sectional view of a light source according to another embodiment of the present invention. Light source 100 is similar to light source 80 discussed above, and hence, elements that serve functions analogous to elements in light source 80 have been given the same numeric designation. In light source 100, the leads are bent downward as shown at 105 and 106 so that a portion of each lead is enclosed by the molding material shown at 107 thus trapping the leads within a body of molding material. Connection to the leads is provided by the exposed portions shown at 105 and 106. In this embodiment, the heat is transferred laterally from die 97 to lead end 105 through the lead. Because the cross-sectional area of the lead increases with the distance from die 97, the additional lead length does not significantly reduce the heat transfer capacity of the lead.

The thermal path from the heat-generating portion of the die to the final heat-dissipating surface is the sum of a number of thermal resistances. The die itself has a thermal resistance that cannot be lowered for any particular die. This represents a minimum thermal resistance that cannot be overcome by the choice of lead. The thermal resistance of the lead between the die and the point at which the lead is thermally connected to the heat transfer surface represents another thermal resistance that inhibits the flow of heat from the die. The bonding agents used to connect the die to the lead and the lead to the underlying printed circuit board or other heat transfer surface are additional thermal resistances. The bonding agents thermal resistance, in general, is also fixed. Hence, as long as the thermal resistance of the lead between the die and the point at which the lead off loads the heat to the heat transfer surface is small compared to the die thermal resistance and the bonding point thermal resistance, further reductions in the lead thermal resistance do not provide a significant improvement in the operating temperature of the die. In cases where a metal-based bonding agent is used (e.g., a metal alloy such as solder or gold-tin), the thermal resistance of the bond between the die and the lead and between the lead and the printed circuit board is small compared to the internal thermal resistance of the die.

A light source according to the present invention can be constructed using conventional lead frame construction techniques, and hence, provide a package with high heat transfer efficiency that can take advantage of the low cost of such construction techniques. In general, a lead frame having the leads for a number of light sources is encapsulated to protect the leads in a plastic body. If a reflector is to be utilized, the reflector can be created as part of the molding process or separately fabricated as a sheet of material with the reflector cavities. The dies can be attached either before or after the reflector is attached. After the wire bonds have been formed, the cavity in the reflector is filled with the encapsulating material, which serves both to protect the dies and further cement the reflector to the underlying substrate having the leads.

While the above-described embodiments include a reflector to redirect light leaving the sides of the dies, embodiments that lack reflectors can also be constructed. Refer now to FIG. 10, which is a cross-sectional view of a light source according to another embodiment of the present invention. Light source 130 is similar to light source 80 discussed above. However, in light source 130 each of the dies is individually encapsulated in a droplet of transparent material. Exemplary droplets are shown at 131 and 132. The individual droplets protect the dies and the wire bonds. In addition, the droplets improve the efficiency with which light is extracted from the dies.

Embodiments in which all of the dies are covered by a single droplet can also be constructed. Refer now to FIG. 11, which is a cross-sectional view of another embodiment of a light source according to the present invention. Light source 135 is similar to light source 130 discussed above. However, in light source 135, a single droplet of encapsulant as shown at 133 covers all of the dies. As noted above, the encapsulant can include light converting materials such as phosphors or diffusants. Additional layers of encapsulant in the form of larger droplets or layers of material can be provided over the droplets shown in FIGS. 10 and 11.

In the above-described embodiments, the leads on which the dies are mounted are constructed from a layer of metal that has a substantially constant cross-section. However, it will be appreciated that the thickness may have small variations. Hence, for the purposes of this discussion, a layer of metal from which a lead is constructed will be said to be of substantially constant thickness if its thickness does not vary by more than 20 percent between the die mounting area and the heat transfer area.

Figure 12:
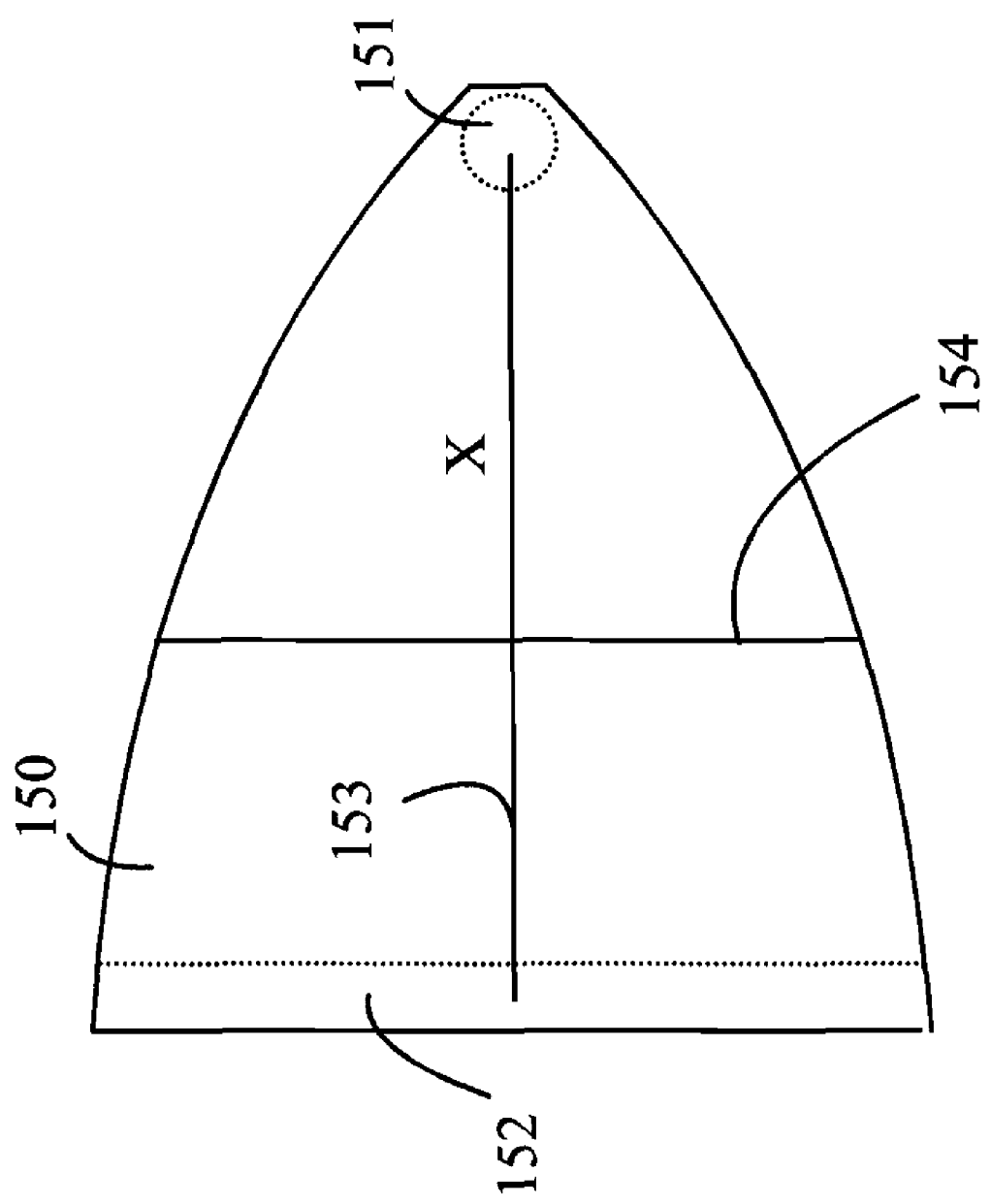
FIG. 12 illustrates another embodiment of a lead according to the present invention.

The embodiments of the present invention discussed above utilize leads having a boundary that is made up of linear segments. Lead arrangements such as those shown in FIG. 7 have the advantage of utilizing more of the area that is available for constructing leads for heat transfer than the prior art designs. However, embodiments in which the boundary has other shapes could also be constructed. Refer now to FIG. 12, which illustrates another embodiment of a lead according to the present invention. Lead 150 includes a die mounting area 151 and a heat transfer area 152. Consider a line 153 drawn between die mounting area 151 and heat transfer area 152. If the width of the lead measured along a line 154 perpendicular to line 153 increases as a function of the distance, X, from die mounting area 151, then the lead will have the desired properties.

Figure 13:
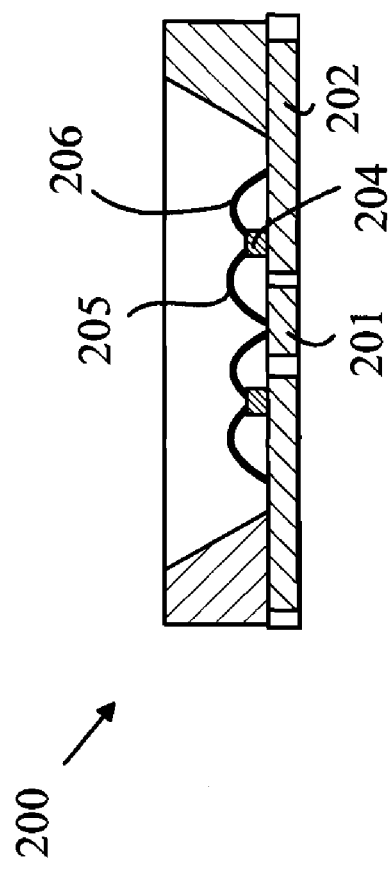
FIG. 13 is a cross-sectional view of a light source according to another embodiment of the present invention.

The above-described embodiments of the present invention utilize LEDs that have one contact on the bottom of the LED die and one contact on the top surface of the LED die. However, embodiments that utilize LED dies having both contacts on the top surface can also be constructed. Refer now to FIG. 13, which is a cross-sectional view of another embodiment of a light source according to the present invention. Light source 200 is similar to light source 80 discussed above in that each LED die is mounted on a lead having a cross-sectional area that increases as a function of the distance between the die and the heat transfer area. An exemplary die is shown at 204 mounted on lead 202. LED die 204, in contrast to the LEDs shown in FIG. 8, has two contacts on the top surface of the dies that are used to power the LED. These contacts are connected by wire bonds to common lead 201 and lead 202 by wire bonds shown at 205 and 206, respectively. In this embodiment, the LED dies are electrically insulated from the underlying leads.

Figure 14:
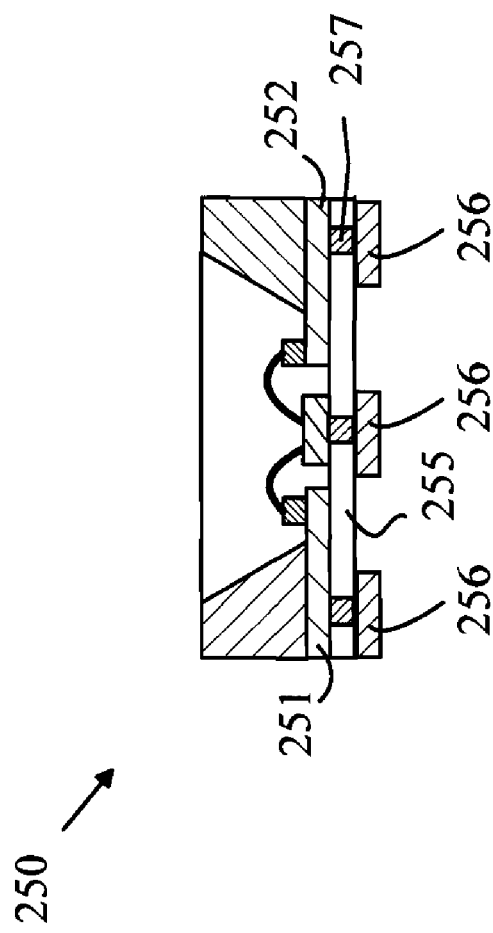
FIG. 14 is a cross-sectional view of a light source according to another embodiment of the present invention.

The above-described embodiments utilize a conventional lead frame that is molded into an insulating package to provide the heat-conducting lead structure. However, embodiments in which the heat-conducting lead structure is patterned on a pre-formed insulating substrate such as a ceramic substrate can also be constructed. Refer now to FIG. 14, which is a cross-sectional view of another embodiment of a light source according to the present invention. Light source 250 is similar to light source 100 discussed above; however, in the case of light source 250, the heat radiating leads 251 and 252 are patterned on a ceramic substrate 255 rather than being molded into an insulating body. The connections to the leads are provided by vias such as via 257 that connect the leads to pads 256 on the bottom surface of substrate 255.

Various modifications to the present invention will become apparent to those skilled in the art from the foregoing description and accompanying drawings. Accordingly, the present invention is to be limited solely by the scope of the following claims.

What is claimed is:

1. A light source comprising:

a first die comprising an LED, the first die having a bottom surface and first electrical contact for applying power to the first die;

a first lead comprising a heat conducting layer of substantially constant thickness having a narrow width die mounting region on which the first die is mounted and connected electrically and thermally and a wide width heat transfer region that is adapted for connection to a heat sink, the narrow width die mounting region and the wide width heat transfer region being separated from one another, the first lead having a cross-sectional width that increases as a function of a distance from the narrow width die mounting region on a path connecting the narrow width die mounting and the wide width heat transfer regions of the first lead;

a second die comprising an LED, the second die having a bottom surface, the second die having a first electrical contact for applying power to the second die;

a second lead comprising a heat conducting layer of substantially constant thickness having a narrow width die mounting region on which the second die is mounted and connected electrically and thermally and a wide width heat transfer region that is adapted for connection to a heat sink, the narrow width die mounting and wide width heat transfer regions being separated from one another, the second lead having a cross-sectional width that increases as a function of a distance from the narrow width die mounting region on a path connecting the narrow width die mounting and the wide width heat transfer regions of the second lead;

a third die comprising an LED, the third die having a bottom surface, the third die having a first electrical contact for applying power to the third die;

a common lead separate from the first and second leads, the first, second, and third dies each comprising a second electrical contact for applying power to that die, the second electrical contacts of the first, second, and third dies all being connected to the common lead; and a body comprising an insulating material that is bonded to a portion of the first and second leads while leaving the heat transfer regions of the first and second leads exposed.

2. The light source of claim 1, wherein the body comprises a ceramic material.

3. The light source of claim 1, wherein the first electrical contact of the first die is on the bottom surface of the first die and is electrically and thermally connected to the first lead.

4. The light source of claim 3, wherein the first electrical contact of the second die is on the bottom surface of the second die and is electrically and thermally connected to the second lead.

5. The light source of claim 4, wherein the first die has a top surface and wherein the second electrical contact of the first die is on the top surface of the first die and is connected to the common lead by a wire bond.

6. The light source of claim 5, wherein a boundary exists between the first and second leads, the bounday having first and second sides, wherein each of the first and second sides have a first end proximate to the narrow die mounting region and the common lead and a second end proximate to the wide width heat transfer region, the first and second sides diverging from one another as a function of a distance from the common lead such that a size of the boundary grows as a function of distance from the common lead.

7. The light source of claim 1 further comprising:

a third lead comprising a heat conducting layer of substantially constant thickness having a narrow width die mounting region on which the second die is mounted and connected electrically and thermally and a wide width heat transfer region that is adapted for connection to a heat sink, the narrow width die mounting and wide width heat transfer regions being separated from one another, the third lead having a cross-sectional width that increases as a function of a distance from the narrow width die mounting region on a path connecting the narrow width die mounting and the wide width heat transfer regions of the third lead, wherein the first electrical contact of the third die is on the bottom surface of the third die and is electrically and thermally connected to the third lead, and wherein the first, second, and third leads are configured symmetrically about the common lead.

8. The light source of claim 1, wherein the body comprises a central region and a periphery and wherein the narrow width die mounting regions are proximate to the central region.

9. The light source of claim 8, wherein the heat transfer regions are proximate to the periphery.

10. The light source of claim 1, wherein the first and second dies are covered with a layer of a material that is transparent to light generated by the LEDs.

11. The light source of claim 1, wherein the light source further comprises a reflector that surrounds the first and second dies and redirects light leaving the dies.

12. A light source comprising:

a plurality of dies, each die having a top and a bottom surface and an LED, each of the die having first and second contacts for powering the die;

a plurality of leads, each lead comprising a layer of metal of substantially constant thickness, the layer comprising a boundary between two leads in the plurality of leads, a narrow width die mounting region at one end of and within the boundary and a wide width heat transfer region at an end opposite to the narrow width die mounting region within the boundary, the boundary width increasing as a function of the distance from the narrow width die mounting region and becoming widest at the wide width heat transfer region, the plurality of leads being arranged such that the narrow die mounting regions are proximate to a first point and oriented such that the plurality of leads radiate from the first point, each of the dies being mounted on a corresponding one of the narrow width die mounting regions; and a body comprising an insulating material, at least a portion of each of the plurality of leads being bonded to the insulating material while leaving the wide width heat transfer regions of each of the plurality of leads exposed.

13. The light source of claim 12, wherein the first contact of each die is electrically connected to the lead containing the narrow width die mounting area corresponding to that die.

14. The light source of claim 12, wherein each of the boundaries has the same shape.

15. The light source of claim 12, further comprising a common electrode, the second contact of each of the dies being connected to the common electrode.

16. The light source of claim 12, wherein the light source comprises a light emitting surface through which light from the LEDs exits the light source and a bottom surface, wherein the exposed wide width regions of the heat transfer regions are located on the bottom surface of the light source.

17. A light source comprising:

a plurality of dies, each die having a top and a bottom surface and an LED, each die having a first electrical contact on the top surface and a second electrical contact on the bottom surface for powering the die;

a plurality of leads, each lead comprising a conductive layer of a substantially constant thickness, the conductive layer comprising a boundary between two of the plurality of leads, a narrow width die mounting region at one end of and within the boundary and a wide width heat transfer region at an end opposite to the narrow width die mounting region within the boundary, wherein the boundary width increases as a function of the distance from the narrow width die mounting region and is widest at the wide width heat transfer region, the plurality of leads being arranged such that the narrow die mounting regions are proximate to a first point and oriented such that the plurality of leads radiate from the first point, each of the dies being mounted on a corresponding one of the narrow width die mounting regions;

a common electrode; and a body comprising an insulating material, wherein the common electrode being in a central region of the body, the narrow width die mounting regions of the plurality of leads being proximate to the common electrode and the wide width heat transfer regions of the plurality of leads being on a periphery of the body, at least a portion of each of the plurality of leads being bonded to the insulating material while leaving the wide width heat transfer regions of each of the plurality of leads exposed.

18. The light source of claim 17, further comprising a reflector surrounding the plurality of LEDs.

19. The light source of claim 17, wherein the light source comprises a light emitting top surface and a heat dissipating bottom surface, wherein light from the LEDs exits the light emitting top surface and heat is dissipated from the light source by means of the exposed leads that are located on the heat dissipating bottom surface.

20. The light source of claim 17, wherein the plurality of exposed leads are configured to be attached to a heat sink.

* * * * *